United States Patent [19]

Brennesholtz et al.

[11] Patent Number: 4,942,063
[45] Date of Patent: Jul. 17, 1990

[54] METHOD FOR CONTROLLING THE THICKNESS DISTRIBUTION OF AN INTERFERENCE FILTER

[75] Inventors: Matthew S. Brennesholtz, Waterloo; Paul J. Patt, Mount Kisco, both of N.Y.

[73] Assignee: North American Philips Corporation, New York, N.Y.

[21] Appl. No.: 340,835

[22] Filed: Apr. 20, 1989

[51] Int. Cl.⁵ ............................................. C23C 16/00
[52] U.S. Cl. ................................. 427/256; 118/720; 118/729; 118/730; 427/248.1; 427/255.5; 427/282
[58] Field of Search ............. 118/720, 721, 729, 730; 427/248.1, 255.5, 282, 256, 346; 204/298, 192.1

[56] References Cited

U.S. PATENT DOCUMENTS

| | | | |
|---|---|---|---|
| 3,636,916 | 1/1972 | Thelen et al. | 118/720 |
| 3,664,295 | 5/1972 | Ng et al. | 118/720 |

FOREIGN PATENT DOCUMENTS

| | | | |
|---|---|---|---|
| 2419523 | 10/1979 | France | 118/720 |
| 52-65783 | 5/1977 | Japan | 118/720 |
| 55-107772 | 8/1980 | Japan | 118/720 |
| 60-100665 | 6/1985 | Japan | 118/720 |
| 61-84370 | 4/1986 | Japan | 118/720 |
| 61-186472 | 8/1986 | Japan | 118/720 |
| 62-10273 | 1/1987 | Japan | 118/720 |
| 62-109968 | 5/1987 | Japan | 118/720 |
| 63-4067 | 1/1988 | Japan | 118/720 |
| 63-121655 | 5/1988 | Japan | 118/720 |

OTHER PUBLICATIONS

Fowler, A. B. and D. R. Young, "Apparatus for Evaporating Thin Coatings with In Situ Control of Thickness", IBM Technical Disclosure Bulletin, vol. 20, no. 7, (Dec. 1977), pp. 2876-2877.

Primary Examiner—Richard Bueker
Assistant Examiner—Terry J. Owens
Attorney, Agent, or Firm—John C. Fox

[57] ABSTRACT

The thickness distribution of a vapor deposited layer such as an interference filter deposited on a moving substrate such as a glass faceplate for a projection television tube, is controlled along an axis in the direction of travel of the substrate by employing at least one rotatable dodger to partially shield the substrate as it passes behind the dodger during deposition.

3 Claims, 5 Drawing Sheets

METHOD FOR CONTROLLING THE THICKNESS DISTRIBUTION OF AN INTERFERENCE FILTER

BACKGROUND OF THE INVENTION

This invention relates to multilayer interference filters formed by vapor deposition onto a moving substrate, and more particularly relates to a method and apparatus for controlling the thickness distribution of the filter layers along the direction of movement.

U.S. Pat. No. 4,683,398 describes a cathode ray tube for projection color television having a multilayer interference filter between the glass face panel and the luminescent screen. Such a filter results, among other things, in significantly greater brightness of the luminescent output of the tube.

Such interference filters are typically composed of alternating layers of materials having a high and a low index of refraction, respectively. The layers are preferably formed by vapor deposition onto the inner surface of the glass face plate.

Mass production of such filters is carried out in a vacuum chamber containing the source materials to be evaporated, means for heating the source materials, and a dome-shaped fixture adapted for holding a multiplicity of glass face plates. The plates are arranged in rows, each row forming a circle around the dome, so that each plate is approximately equidistant with the other plates from the source materials.

The dome is rotated during deposition, not only to promote uniform distribution of the deposited material on the plates, but also to pass the plates behind one or more stationary dodgers located between the source materials and the plates. These dodgers are designed to result in increasing thickness of the layers toward the edges of the plates, which has been shown to result in even greater increases in brightness than can be obtained for a uniform thickness distribution.

Ideally, the thickness of the layers should increase in all directions from the center of the plate. Unfortunately, however, such an arrangement as described above can only be used to control thickness distribution in a direction normal to the direction of movement of the plates.

A method is known by which a radial thickness distribution can be achieved. This so called "planetary" method involves rotating each plate about an axis normal to the surface of the plate, while the plate passes behind the dodger as described above. However, in addition to adding to the complexity of the apparatus, the rotating plates require significantly more space in the dome than do stationary plates. Thus, the throughput of the apparatus is significantly reduced. Also, in the case of skirted panels, the planetary drive is adequate only for circularly symmetric plates or "discs", and not for rectangular plates.

OBJECTS AND SUMMARY OF THE INVENTION

Accordingly, it is an object of the invention to control the thickness distribution of a vapor deposited layer on a moving substrate in the direction of travel of the substrate.

It is another object of the invention to control the thickness distribution in such direction without rotation of the substrate about an axis normal to the surface of the substrate.

In accordance with one aspect of the invention, a method of controlling the thickness distribution of a vapor deposited layer on a moving substrate in the direction of travel of the substrate, comprises the steps of: (a) providing at least one dodger between the source material and the path of the substrate; and (b) rotating the dodger about an axis normal to the direction of travel of the substrate and substantially parallel to the plane of the dome or substrate when the substrate is at least partially behind the dodger, so that during rotation of the dodger the substrate is partially shielded from and partially exposed to the source material.

In accordance with a preferred embodiment of the method, the rotating dodger is used in conjunction with at least one fixed dodger employed to control thickness distribution of the deposited layer in a direction normal to he direction of travel of the substrate.

In accordance with another aspect of the invention, an apparatus is provided for carrying out the above method, the apparatus comprising a vacuum chamber containing at least one source material and means for heating the source material to vaporize it, means for moving a plurality of substrates relative to the source material while maintaining the substrates in positions approximately equidistant from the source material, at least one dodger, rotatably mounted between the source material and the path of the substrates, the axis of rotating of the dodger being normal to the direction of travel of the substrates, and substantially parallel to the substrate plane and means for rotating the dodger when a substrate is at least partially behind the dodger, so that during rotation of the dodger the substrates are at least partially shielded from and partially exposed to the source material.

In a preferred embodiment of the apparatus, the means for moving the substrates comprises a rotatably mounted dome-shaped fixture, the fixture adapted for holding the substrates in one or more circular rows and for moving the substrates in these circular rows above the source material. The rotatable dodger may be used in conjunction with at least one fixed dodger mounted between the source material and the path of the substrates, the dodgers being spaced apart from one another so that they shield the substrates at different times during the substrates' travel about the source material.

DESCRIPTION OF THE PREFERRED EMBODIMENTS

Figure 1:
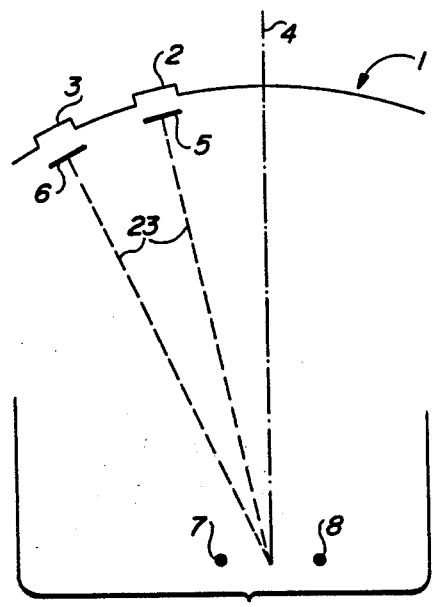
FIG. 1 is a diagrammatic representation of the positional relationship between source material, substrates and fixed dodger in a prior art vapor deposition apparatus.

FIG. 1 shows the positional relationship between source material, substrates and fixed dodger in a prior art vapor deposition apparatus. Dome-shaped fixture 1 holds substrates 2 and 3 in positions which are approximately equidistant from source materials 7 and 8. Fixture 1 rotates about an axis 4. Fixed dodgers 5 and 6 shield substrates 2 and 3 respectively from the path of vapor from the source materials each time the rotating fixture brings the substrate behind the dodger.

In the application envisioned for the invention, the substrates are glass face panels for cathode ray tubes for projection television, and the source materials are usually oxides of silicon and titanium or tantalum, which are deposited on the inner surfaces of the substrates in alternate layers. Oxidation is later completed to form an interference filter of alternating layers of $SiO_2$ and $TiO_2$ or $Ta_2O_3$ having low and high indices of refraction, respectively.

In this application, the ability to control the thickness distribution of the filter layers across the face plate enables the optimization of certain operating characteristics of the projection tubes such as lumen output to the projection optics.

Figure 2:
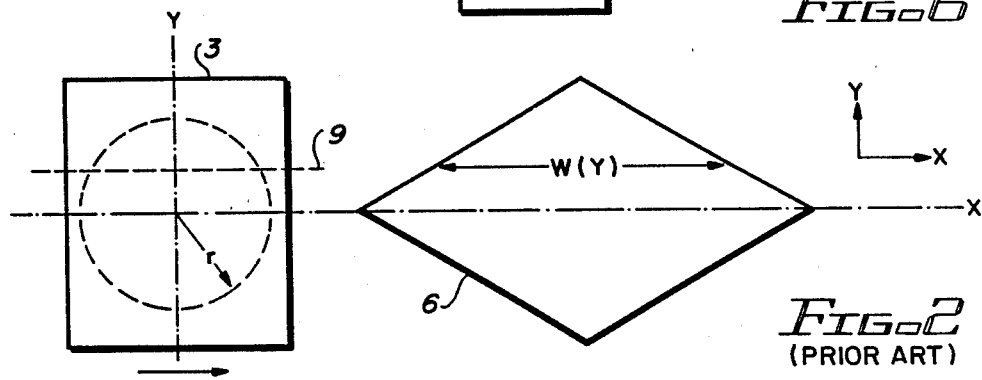
FIG. 2 is a diagrammatic representation of the relationship between substrate and dodger as viewed from the source in the apparatus of FIG. 1.

A certain degree of control over thickness distribution is possible using fixed dodgers such as dodgers 5 and 6 shown in FIG. 1. FIG. 2 shows the relationship between dodger 5 and substrate 3 as viewed from the position of the source materials. Substrate 3 is a glass face plate which is rectangular in shape. The long axis of the face plate is conventionally referred to as the major axis which in this Figure corresponds to the Y axis. The short axis is the minor axis and here corresponds to the X axis, which represents the circular path of travel of the substrate caused by the rotation of fixture 1, as viewed in the plane of the circle.

Dodger 5 has a width W which varies as a function of distance Y from the X axis. As the substrate is moved behind the dodger, the substrate is shielded from the evaporation source and less material is deposited on the substrate than would otherwise be the case. If the dodger had approximately straight sides parallel to the Y axis, all of the substrate would be shielded for the same proportion of the time and the distribution of the deposited layer would not change. However, since the dodger width varies as a function of Y, the substrate exposure time also varies along the Y axis and the thickness of the deposit also changes.

Figure 3A:
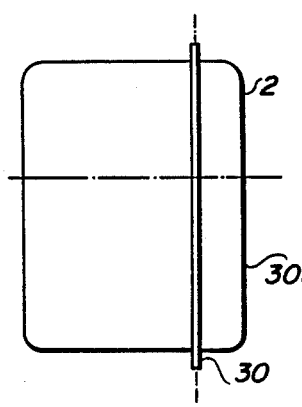
FIGS. 3a–3c are a diagrammatic representation of the relationship between a substrate and a rotatable dodger as viewed from the source in accordance with the invention.
Figure 3B:
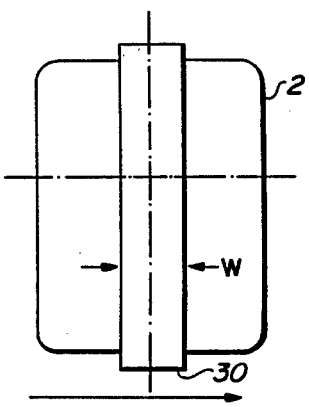
Figure 3C:
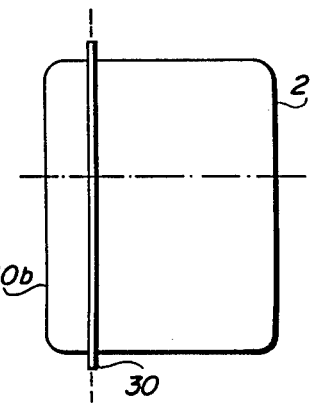

It is not possible to control thickness along the minor axis with static dodgers of any geometry. In accordance with the invention, thickness along the minor axis is controlled using a rotating dodger. FIG. 3a-3c show an arrangement as viewed from the position of the source materials in which dodger 30 is mounted between the source and the substrate 2 to rotate along its longitudinal axis, parallel to the Y axis of the substrate. While FIGS. 3a-3c show the dodger as having a constant width, W, the width can vary to fine tune the final thickness distribution.

The dodger is normally in an open position, that is, normal to the substrate surface, allowing essentially unobstructed access of the vapor from the source to the substrate. As shown in FIGS. 3a-3c, as the leading edge of substrate 2 passes by dodger 30, the dodger rotates to a closed position (FIG. 3b) to shield the central part of the substrate behind the dodger from the vapor. As the trailing edge of the substrate 30b approaches the dodger, the dodger again rotates to an open position (FIG. 3c).

Figure 4:
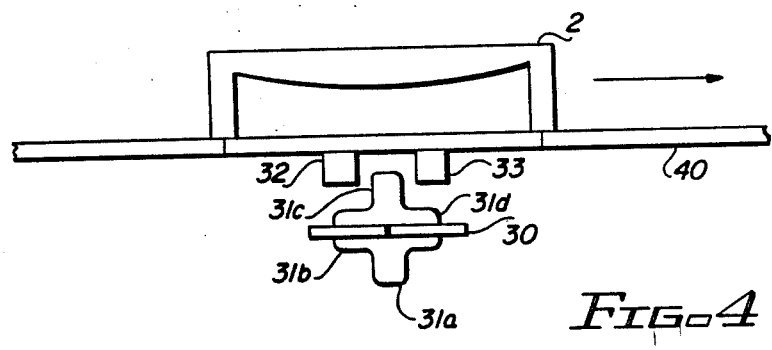
FIG. 4 is an end view of a substrate and rotatable dodger and one embodiment of a mechanical means for rotating the dodger synchronously with the passage of the substrate behind the dodger.

A typical mechanical arrangement for achieving the rotation of the dodger synchronously with the passage of the substrate is shown in FIG. 4. Dodger 30 is attached to a cam 31 having four protruding fingers 31a through d. Studs 32 and 33 protrude downward from fixture 40. As the fixture 40 carries substrate 2 past dodger 30, fingers of cam 31 successively engage studs 32 and 33. Each time a cam finger engages a stud, the dodger is rotated 90 degrees.

Figure 5:
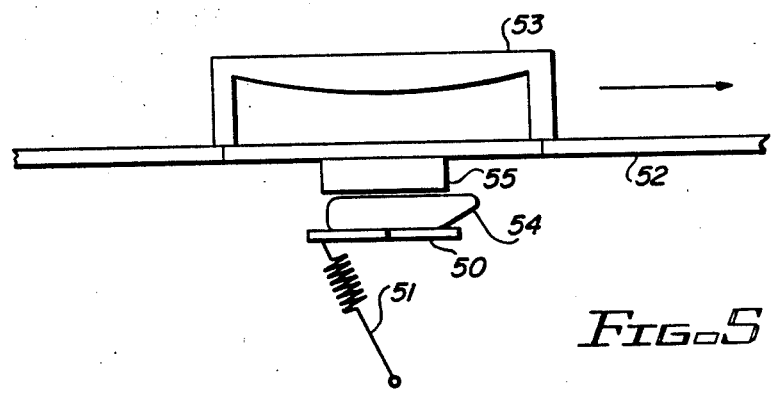
FIG. 5 is an end view similar to that of FIG. 4 showing another embodiment of mechanical means for rotating the dodger synchronously with the passage of the substrate.

Another embodiment of a mechanical arrangement of rotating the dodger is shown in FIG. 5. In this arrangement, the dodger 50 is held in a normally open position by spring 51. As fixture 52 brings substrate 53 past dodger 50, cam 54 engages stud 55 and rotates dodger 50 into a closed position. When stud 55 disengages cam 54, spring 51 rotates dodger 50 back to an open position. Other arrangements will become apparent to those skilled in the art.

By contouring the studs and the cams, the speed of opening and closing the dodger can be controlled, thereby controlling the distribution profile in the area between the center and the edge of the substrate.

Figure 7:
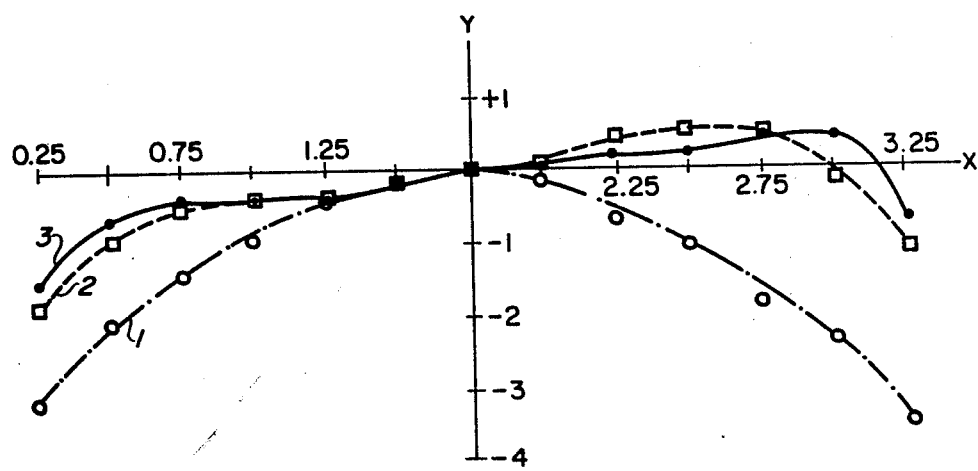
FIG. 7 is a graph of thickness distribution of a layer deposited along the minor axis of a face panel in accordance with the invention.

A typical thickness distribution along the minor axis achieved by such an arrangement is shown graphically in FIG. 7. The thickness of the deposited layer is plotted in terms of percent deviation from center thickness along the Y axis, versus distance in inches along the minor axis, here the X axis. Three curves are presented, all of which represent thickness distributions obtained on 20 layer $SiO_2/TiO_2$ filtering in a 1100 mm vacuum coater containing 24 substrates in two rows. The collet rotated at 30 RPM and coating time was about 1.5 minutes per layer for $SiO_2$ and 3 minutes per layer for $TiO_2$. Curve 1 represents the thickness distribution obtained without the use of a rotating dodger, while curves 2 and 3 represent the thickness distributions obtained when using two rotating dodgers 1' wide, mechanically driven with a system similar to the one pictured in FIG. 5.

Figure 6:
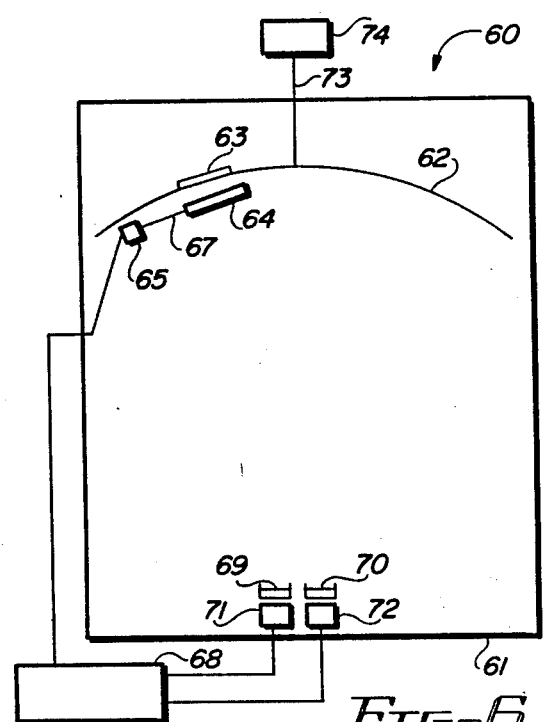
FIG. 6 is a diagrammatic representation of a vapor deposition apparatus of the invention showing computer controlled means for rotating the rotatable dodger.

A suitable apparatus 60 for carrying out the method of the invention is shown schematically in FIG. 6. The vacuum enclosure 61 contains the rotating collet 62. The collet is supported by a shaft 73 and rotated by a motor 74 located outside the vacuum chamber 61. Collet 62 holds at least one substrate 63 having a surface exposed to the interior of the enclosure. Rotating dodger 64 is mounted between substrate 63 and sources 69 and 70. The sources are heated to evaporation temperatures by separate heaters 71 and 72, typically using electron heating means.

The apparatus includes means for rotating the dodger comprising motor 65 connected to dodger 64 by drive coupling 67. The motor may be located inside or outside the vacuum chamber 61. Both the motor 65 and the heaters 71 and 72 are controlled by computer 68. One advantage of this arrangement is that the dodger can be rotated at any one of a range of speeds selected by inputting appropriate commands into the computer. Thickness distribution can be controlled by controlling the rate at which the dodger is rotated, or in systems where many revolutions per layer are made, by controlling the amount of time the dodger is held open or closed. Further advantages include a generally smoother rotation of the dodger than can be obtained using mechanical means and the ability to automatically control the heaters in accordance with a desired schedule.

As will be appreciated, there is a limit to the amount of correction to the thickness distribution of the deposited layer which can be obtained from a single dodger. For the conditions described with reference to FIG. 7, it is seen that the use of a dodger in accordance with the invention results in a maximum thickness at the edge of the substrate about 1.7 percent greater than the thickness obtained without such a dodger. Of course, for greater corrections than can be obtained with a single dodger, multiple rotatable dodgers may be used.

Other means can be used to synchronize the motion of the dodger and the motion of the collet. The dodger can be driven by a belt, chain or gear train from the collet, collet shaft or collet drive motor.

If it is desired that the layer thickness decrease from center to edge of the substrate, the dodger can be normally closed instead of normally open, and rotate to the open position at the central region of the substrate, instead of close.

The rotatable dodger described herein can be used in conjunction with a fixed dodger of the prior art. With such a combination, the thickness distribution can be made a nearly arbitrary function of X and Y by making one or more of the following adjustments:

(a) changing the shape of the fixed dodger;
(b) changing the width of the rotatable dodger along its length;
(c) changing the shape of the cams and studs that drive the dodger or otherwise controlling the rates at which the dodger opens and closes or the amount of time the dodgers are held open or closed;
(d) changing the number of fixed and/or rotatable dodgers in the system.

The invention has been described in terms of a limited number of embodiments. Other embodiments and variations of embodiments will become apparent to those skilled in the art, and these are intended to be encompassed within the scope of this description and the appended claims.

We claim:

1. A method of controlling the thickness distribution of a vapor deposited layer on a moving substrate in the direction of travel of the substrate, the layer formed by vaporizing a source material in the vicinity of the moving substrate, the method comprising the steps of:
    (a) providing at least one rotatable dodger between the source material and the path of the substrate;
    (b) rotating the dodger about an axis parallel to the plane of the substrate and normal to the direction of travel of the substrate when the substrate is at least partially behind the dodger,
    so that during rotation of the dodger the substrate is partially shielded from and partially exposed to the source material.

2. The method of claim 1 in which in addition to the rotatable dodger, at least one fixed dodger is employed to control thickness distribution of the vapor deposited layer along an axis normal to the direction of travel of the substrate.

3. The method of claim 1 in which the sides of the rotatable dodger normal to the direction of travel are parallel to each other and to the axis of rotation of the dodger.

* * * * *